United States Patent
Li et al.

(10) Patent No.: US 6,579,630 B2
(45) Date of Patent: Jun. 17, 2003

(54) DEUTERATED SEMICONDUCTING ORGANIC COMPOUNDS USED FOR OPTO-ELECTRONIC DEVICES

(75) Inventors: Xiao-Chang Charles Li, Union City, CA (US); Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/732,511

(22) Filed: Dec. 7, 2000

(65) Prior Publication Data

US 2002/0076576 A1 Jun. 20, 2002

(51) Int. Cl.$^7$ ................................................ H05B 33/14
(52) U.S. Cl. ........................ 428/690; 428/917; 428/704; 313/304; 313/306; 252/301.16; 252/301.33; 257/40; 257/103
(58) Field of Search ................................ 428/690, 917, 428/704; 313/304, 306; 252/301.16, 301.33; 257/40, 103

(56) References Cited

U.S. PATENT DOCUMENTS

| | | | |
|---|---|---|---|
| 3,475,507 A | 10/1969 | Sedlak | 260/668 |
| 3,655,372 A | 4/1972 | Krohn et al. | 96/1.3 |
| 4,134,843 A | 1/1979 | Rebuck et al. | 252/28 |
| RE31,868 E | 4/1985 | Beasley et al. | 350/96.3 |
| 4,898,855 A | 2/1990 | Baggiolini et al. | 514/167 |
| 5,225,495 A | 7/1993 | Han et al. | 525/327.4 |
| 5,254,633 A | * 10/1993 | Han et al. | 525/327 |
| 5,846,514 A | 12/1998 | Foster et al. | 424/1.81 |
| 5,872,387 A | 2/1999 | Lyding et al. | 257/607 |

OTHER PUBLICATIONS

Allinger, Norman L., et al., "Isotope Effects in Molecular Mechanics (MM2), Calculations on Deuterium Compounds.", Journal of Computational Chemistry, vol. 4, No. 3, 399–403 (1983) No month.

Baldo, M.A. et al, "Very High–efficiency Green Organic Light–Emitting Devices Based on Electrophosphorescence," American Institute for Phsyics, 1999, 4–6 No month.

Burin, Alexander L., et al., "Spin Effects On The Luminescence Yield of Organic Light Emitting Diodes," American Institute of Physics, 6092–6102, (1983) No Month.

Burroughes, J.P., et al., "Light–emitting Diodes Based on Conjugated Polymer," Nature, vol. 347, 539–541, Oct. 11, 1990.

Friend, R.H., et al., "Electroluminescence in Conjugated Polymers.", Nature, vol. 297, 121–128, Jan. 14, 1999.

Garnier, Francis, et al., "All–Polymer Field Effect Transistor Realized by Printing Techniques.", Science, vol. 265, 1684–86, Sep. 16, 1994.

Gelinck, G.H., et al., "High–Performance All–Polymer Integrated Circuits.," Applied Physics Letters, vol. 77, No. 10, 1487–89, Sep. 4, 2000.

Hide, Fumitomo et al., "New Development in the Photonic Applications of Conjugated Polymers," Accounts of Chemical Research, vol. 30, No. 10, 430–36, 1997 No month.

Kraft, Arno et al., "Electroluminescent Conjugated Polymers—Seeing Polymers in a New Light," Chem, Int. Ed. 1998, 37, 402–428 No Month.

Lee, Jinju et al., "Application of High Pressure Deuterium Annealing for Improving the Hot Carrier Reliability of CMOS Transistors," IEEE Electron Device Letters, vol. 31, No. 3, May, 2000, 221–223.

Matsumoto, Takahiro et al., "Electroluminescence From Deuterium Terminated Porous Silicon," Jpn. J. Appl. Phys. vol. 36 (1997), 1089–1091, Part 2, No. 8B No month.

McGehee, Michael D., et al., "Semi–Conducting (Conjugated) Polymers as Materials for Solid–State Lasers," Adv. Mater. Nov. 16, 2000 12. No. 22, 1655–1668.

Polimeni, A.. et al., "Giant Photoluminescence Enhancement in Deuterated Highly Strained InAs/GaAs Quantum Wells," Appl. Phys. Lett. 65 (10), Sep. 5, 1994, 1254–56.

Ramasamy, Savakkattupala M., et al., "Comparative Study of the Solid–Matrix Luminescence Properties of Perdeuterated Pnenanthrene and Phenantherene absored on Several Solid Matrices," Applied Spectroscopy, vol. 50, No. 9, 1996, 1140–44.

Tang, C.W. et al., "Organic Electroluminescent Diodes," Appl. Phys., Lett., vol., 51, No. 12, Sep. 21, 1987, 913–915.

Virgili, Tersilla et al., "Efficient Energy Transfer from Blue to Red in Tetraphenylporphyrin–Doped Poly(9,9–dioctylfluorene) Light–Emitting Diodes," Adv. Mater., 2000, 12, No. 1, 58–62 No month.

* cited by examiner

*Primary Examiner*—John J. Zimmerman
*Assistant Examiner*—Ling Xu
(74) *Attorney, Agent, or Firm*—Fitzpatrick, Cella, Harper & Scinto

(57) ABSTRACT

Organic semiconductors consisting of conjugated chromophores wherein one or more hydrogen atoms are deuterated are disclosed. Methods of preparing such organic semiconductors are described. The organic semiconducting compounds exhibit remarkably high luminescence and good thermal stability. Applications of these materials for opto-electronic devices, such as light-emitting devices and photodiodes, with enhanced performance and lifetime are disclosed. The disclosed materials can be used as emissive layer, charge-transporting layer, or energy transfer (i.e. phosphorescence dopant) material in organic light-emitting devices.

8 Claims, 7 Drawing Sheets

DEUTERATED SEMICONDUCTING ORGANIC COMPOUNDS USED FOR OPTO-ELECTRONIC DEVICES

TECHNICAL FIELD

The present invention relates to new semiconducting organic compounds and/or polymers for use in optoelectronic devices that contain completely or partially deuterated conjugated backbones, which can promote luminescence and thermal stability of the materials. More particularly, the present invention relates to the effective modification of the molecular structure of known luminescent materials with conjugated backbones containing hydrogen atoms by replacing one or more of the hydrogen atoms with deuterium atoms. The resulting deuterated material is significantly altered and has greatly improved performance over known luminescent light-emitting materials.

BACKGROUND OF THE INVENTION

Organic semiconductors have the benefit of low cost processing, easy control of properties by changing chemical structures, and attractive electronic properties. These materials are usually composed of conjugated chromophores linked by saturated or unsaturated linkage units. Many interesting applications have been explored in recent years, such as organic light-emitting devices [C. W. Tang, S. A. Van Slyke, *Appl. Phys. Lett.,* 1987, 51(12), 913; J. H. Burroughes; D. D. C. Bradley; A. R. Brown; R. N. Marks; K. Mackay; R. H. Friend; P. L. Bum and A. B. Holmes, *Nature* 1990, 347, 539. R. H. Friend; R. W. Gymer; A. B. Holmes; J. H. Burroughes; R. N. Marks; C. Taliani; D. D. C. Bradley; D. A. Dossantos; J. L. Bredas; M. Logdlund and W. R. Salaneck, *Nature* 1999, 397, 121.], organic lasers [F. Hide; M. A. Diaz-Garcia; B. J. Schwartz and A. J. Heeger, *Acc. Chem. Res.* 1997, 30, 430.], organic thin-film transistors [F. Gamier, R. Hajlaoui, A. Yassar, P. Srivastava, *Science,* 1994, 265, 1684], and organic photodiodes.

One application of organic semiconductors is as an active flat-panel display or organic light-emitting device (OLED). Such devices offer many unique features, including a low cost, full color, active display with the possibility of a thinner, lighter, larger and more flexible display module, with wider viewing angles (>160°), compared to conventional flat-panel display devices. All these features imply a strong competitive alternative to replace present LCD displays. Such devices consist of one or several semiconducting organic layer(s) sandwiched between two electrodes. When an electric field is applied, electrons are injected by the cathode into the lowest un-occupied molecular orbital (LUMO) of the adjacent molecules, and holes are injected by the anode into the highest occupied molecular orbital (HOMO). As a result of recombination of electrons and holes, an excited state, called singlet exciton, is formed which returns back to the ground state upon emission of light corresponding to the energy band gap of the emissive material. The selection of emissive materials not only can influence the emission color, but also the light emission efficiency (photons per injected electron) and the light emission brightness and lifetime. In practical display applications, color purity, light-emission efficiency, brightness and lifetime are important parameters.

There have been various organic semiconductor materials developed in the past a few years [Y. Sato, *Semiconductors & Semimetals,* 2000, 64, 209; A. Kraft; A. C. Grimsdale and A. B. Holmes, Angew. Chem.—Int. Ed. In Engl. 1998, 37, 402; Li, X. -C., Moratti, S. C.; In *Photonic Polymer Systems: Fundamentals, Methods, and Applications*; Wise, D. L.; Wnek, G. E.; Trantolo, D. J.; Cooper, T. M.; Gresser, J. D.; Eds.; Marcel Dekker, Inc.: New York, Chapter 10, 1998, p. 335]. Many prototypes of OLED display modules have been demonstrated with the use of organic luminescent compounds (small molecular compounds or polymers). However, only limited commercial products of OLEDs have been launched, due both to the difficulty of technological integration and to the overall performance of the present organic semiconducting materials, which include emissive materials and charge transporting materials. Accordingly, there is a need in the art to develop new materials that exhibit combinatory high performance of luminescence, excellent stability, and good lifetime.

The search for new organic materials used for optoelectronic devices, such as organic light-emitting devices, has been a very active field in recent years. This includes research relating to organic semiconductors and organic polymeric materials that present strong luminescence and good processibility. Most researchers have focused on varying the structure of either the core chromophore and/or polymer backbone, and on modifying linkages for solubility, for charge injection ability, or for other processing functionality. These methods require innovative molecular design, coupled with skillful chemical synthesis, which are time consuming and expensive in order to screen off undesired products.

It is an object of the present invention to provide a unique and effective manner to chemically modify known and novel optoelectronic materials by replacing protons with deuterium atoms on the conjugated chromophores. It is another object of the invention to provide a method to design and synthesize new luminescent organic materials containing deuterium atoms for their application in optoelectronic devices, such as light-emitting devices. It is further another object of the invention to improve OLED performance with brighter luminance and better thermal stability.

SUMMARY OF THE INVENTION

The present invention relates to deuterated semiconductor organic compounds used in optoelectronic devices and to processes of preparing such deuterated compounds. In one process within the scope of the present invention, known and novel organic semiconductor compounds are deuterated by replacing one or more hydrogen atoms covalently bonded to carbon atoms with deuterium atoms.

Deuterium is a non-radiative isotope of hydrogen, which is sometimes called heavy hydrogen due to its doubled atomic mass. The difference between hydrogen and deuterium has fairly small chemical effects; however, there are important physical effects because of the mass difference between the isotopes. The heavier isotope, deuterium, lies lower in the potential well, and hence has a lower zero-point energy and vibration frequency, and smaller vibration amplitude than hydrogen. Because of the asymmetry of the potential well, bond lengths and bond angles involving deuterium are different than those involving hydrogen. The observed smaller amplitude of the C-D stretching and bending motion, relative to C-H, should be best accounted for with a smaller van der Waals radius for D than for H. The weak vibronic coupling in the deuterated system has been used to theoretically predict higher fluorescence quantum yield [A. L. Burin and M. A. Ratner, *J. Chem. Phys.,* 1998, 109, 6092]. Spectroscopic studies indicate that deuterated phenanthrene has a smaller non-radiative triplet rate constant than its aromatic molecule [S. M. Ramasamy, R. J. Hurtubise, *Appl. Spectroscopy*, 1996, 50(9), 1140].

Deuterium is also found to act as an apparent electron-donating inductive substituent relative to hydrogen. The isotope effects may be applied in the design of new luminescent materials with enhanced charge-injection ability. Additionally, it is know that the C-D bond is shorter than the C-H as a result of the anharmonicity of the bond stretching potential. [M. L. Allinger and H. L. Flanagan, J. Computational Chem. 1983, 4(3), 399]. This means the carbon-deuterium chemical bond is stronger, more stable, and reacts more slowly than the carbon-hydrogen chemical bond, so that the deuterated organic system has better thermal stability, and longer lifetime in optoelectronic devices. Deuterated luminescent material may also have a higher electroluminescent quantum yield as a result of smaller non-radiative triplet rate.

In the prior art, deuterated hydrocarbon lubricants have better anti-oxidation and improved stability than normal hydrocarbon lubricants [U.S. Pat. No. 4,134,843]. A deuterated polymer has been used for optical fiber with low attenuation optical loss [U.S. Pat. No. RE031,868]. Deuterated pharmaceuticals or drugs can enhance drug's efficacy and activity. [U.S. Pat. No. 4,898,855 and U.S. Pat. No. 5,846,514]. Deuterium-treated semiconductor devices have been disclosed [U.S. Pat. No. 5,872,387], wherein degradation of inorganic semiconductor devices has been reduced by using deuterium passivation; deuterium incorporation at the $SiO_2/Si$ interface has been reported to improve the hot carrier reliability of CMOS transistors. [J. Lee, K. Cheng, et al, *IEEE Electron Device Letters*, 2000, 21(5), 221]. Compared with normal hydrogen treated device, the deuterium treated device has a significant lifetime improvement (90 times).

The deuterated organic semiconductor materials within the scope of the present invention are preferably luminescent. Luminescence here means either fluorescence (singlet emission) or phosphorescence (triplet emission). The deuterated organic semiconductor materials may possess charge injection (electron injection or hole injection), hole blocking, or exciton blocking properties. As used herein, hole blocking property means that the semiconductor material allows electrons to transport, but not holes. Whenever a material has a low mobility for hole transporting (less than $10^{-6}$ cm/V·s), or a very high HOMO (highest occupied molecular orbital) level, the material normally possesses hole blocking properties. As used herein, exciton blocking property means that excitons are confined within an emissive layer by using another material layer which does not readily transport excitons (usually non-emissive layer).

The deuterated organic semiconducting material preferably possesses a strong energy transfer property. As used herein, energy transfer includes a Forster process where a higher energy singlet transfers to a lower energy singlet. An example is a blue emissive polymer (host) doped with red emissive material (guest) [like tetraphenylporphyrin doped polyfluorene reported by T. Virgili, et al., *Adv. Mater.*, 2000, 12(1), 58]. The doping level is usually from 0.1–15%, but more than 90% energy will transfer into the red emissive material, thus lead to red emission rather than blue emission. As used herein, energy transfer also includes an intersystem transfer where the singlet energy transfers to a triplet, and thus lead to phosphorescence. An example is a yellow emissive polymer doped with rare earth metal complexes to lead to electrophosphorescence [M. D. McGehee, et al., *Adv. Mater.*, 1999, 11(16), 1349; *Appl. Phys. Lett.*, 1999, 75, 4]. This triplet-emission can potentially lead to very high quantum efficiency because the maximal probability of a triplet is 75%.

The deuterated organic semiconducting materials preferably produce more singlet energy states for light-emission, compared to non-deuterated materials. With the injection of holes and electrons into a luminescent organic semiconductor or a luminescent polymer, an excited state, called exciton, is formed. For most organic fluorescent materials, the maximum singlet exciton production probability under electrical excitation is about 25%. Deuterated materials may exceed that limit for electrofluorescence because of their slow triplet production rate. Therefore, deuterated materials may efficiently produce more singlet excitons than non-deuterated materials, with a potential singlet exciton production exceeding 25%. Since the EL light emission efficiency is directly related with the production rate of singlet exciton, higher exciton production results in higher EL efficiency.

DETAILED DESCRIPTION OF THE INVENTION

Figure 1:
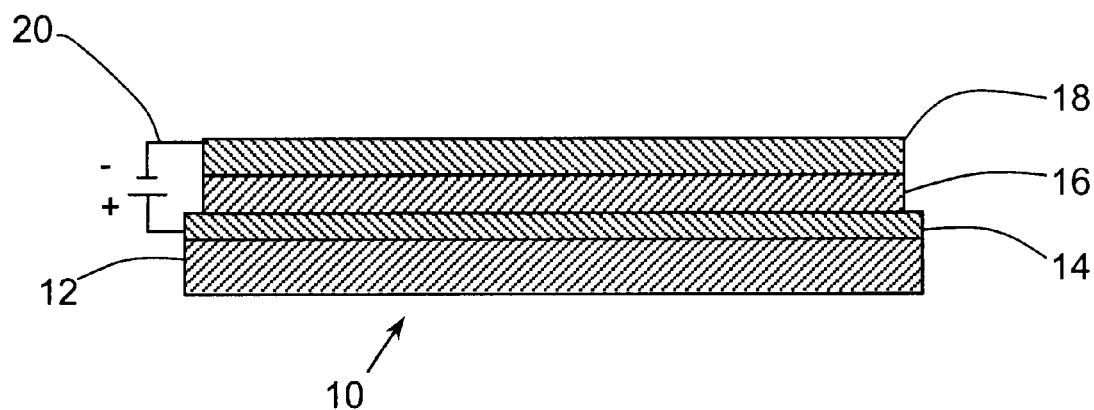
FIG. 1 is a cross-section illustration of a typical single layer light emitting device.

Virtually all organic luminescent materials now marketed contain hydrogen atoms, each of which has a molecular mass of one. According to the present invention one or more of the hydrogen atoms on a conjugated chromophore or a conjugated polymer are deuterated. The molecular mass becomes higher, and the optical and electronic properties of the conjugated luminescent material are altered and improved. The deuterated organic semiconductor has improved performance, for instance, higher fluorescence yield and more stability than its non-deuterated analogue.

There are several deuterated structures or structural combinations that may be used to form conjugated chromophores that are useful for opto-electronic applications, with particularly application in light-emitting devices.

1. A conjugated chromophore, as used herein, includes a linear conjugated organic compound or a polymer with at least 5 conjugated bonds, wherein protons linked to the conjugated bonds are partially or fully deuterated. Examples of typical backbones of conjugated chromophore compounds for this category can be described as in Scheme 1:

Scheme 1
Linear conjugated organic compounds and polymers

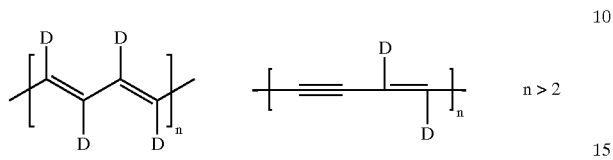

If partially deuterated, the un-deuterated sites for the compounds or polymers in Scheme 1 may be linked with hydrogen atoms, halogens such as F, Cl, Br, etc; or alkyl, alkoxyl, thiol, silyl; aromatic rings such as phenyl and naphthalene; or heteroaromatic rings, such as thiophene, pyridine, and quinoline.

2. A conjugated chromophore, as used herein, also includes a cyclic ring, fused cyclic ring, and combinations thereof, that form a conjugated organic compound or a polymer with at least 5 conjugated bonds, wherein protons linked to the conjugated bonds are partially or fully deuterated. Examples of typical backbones of conjugated organic compounds for this category can be described as in Scheme 2, below. The protons linked with aromatic rings of the compounds in Scheme 2 should be partially or fully deuterated. If partially deuterated, the un-deuterated sites may be linked with hydrogen atoms, halogens such as F, Cl, Br, etc.; or alkyl, alkoxyl, thiol, silyl; aromatic rings such as phenyl and naphthalene; or heteroaromatic rings, such as thiophene, pyridine, and quinoline.

Scheme 2
Cyclic and fused ring combinations.

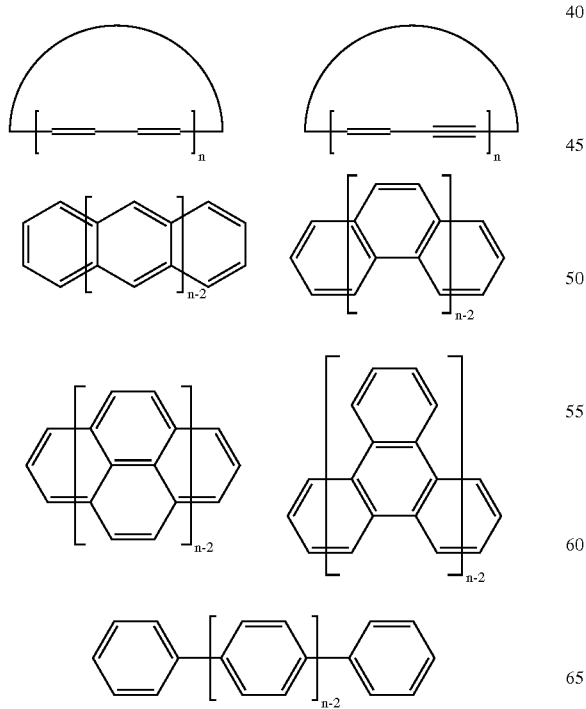

-continued

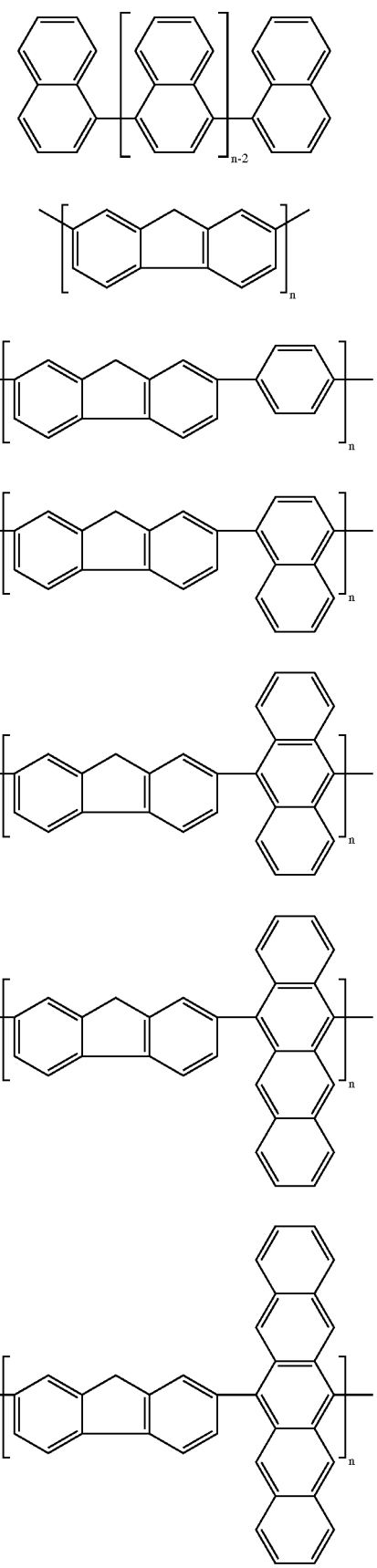

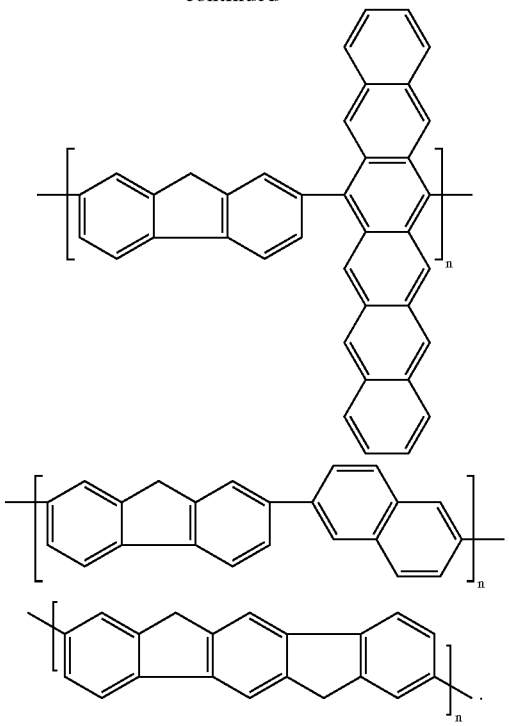

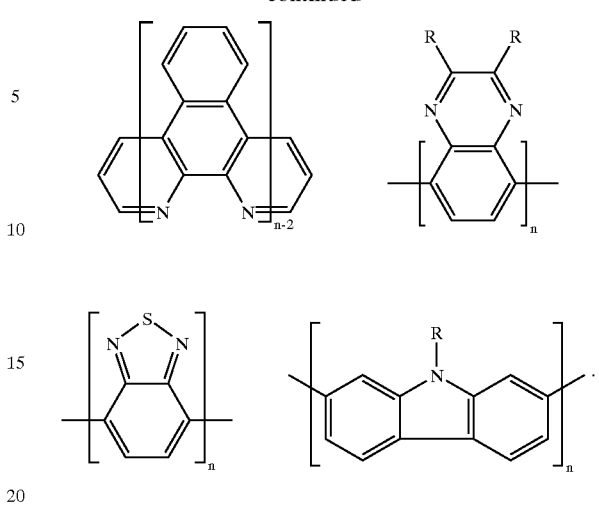

3. A conjugated chromophore, as used herein, also includes heterocyclic ring, fused heterocyclic ring, and combinations thereof, that form a conjugated organic compound or a polymer with at least 5 conjugated bonds, wherein protons linked to the conjugated bonds are partially or fully deuterated. Examples of typical backbones of conjugated organic compounds for this category can be described as in Scheme 3. The protons linked with the heterocyclic rings of the compounds in Scheme 3 should be partially or fully deuterated. If partially deuterated, the un-deuterated sites may be linked with hydrogen atoms; halogens such as F, Cl, Br, etc.; alkyl, alkoxyl, thiol, silyl; aromatic rings such as phenyl and naphthalene; or heteroaromatic rings, such as thiophene, pyridine, and quinoline.

4. A conjugated chromophore, as used herein, also includes a metal chelated compound or a organometallic compound with a formula of $C_A M_B$, where C denotes a chromophore selected from category 1, 2 or 3; and M denotes a metal selected from, Li, Na, K, Be, Mg, Ca, Ti, Cr, Mo, Mn, Fe, Ru, Os, Co, Rh, Ir, Ni, Pd, Pt, Cu, Zn, Cd, B, Al, Ga, In, Si, N, P; A and B denote the number from 1 to 10, preferentially 1–4. The protons linked with the chromophore material of the compounds in Scheme 4 should be partially or fully deuterated. Examples of this category compounds are presented in Scheme 4. If partially deuterated, the un-deuterated sites may be linked with hydrogen atoms, halogens such as F, Cl, Br, etc.; alkyl, alkoxyl, thiol, silyl; aromatic rings such as phenyl and naphthalene; or heteroaromatic rings, such as thiophene, pyridine, and quinoline.

Scheme 3
Heterocyclic/fused ring heterocyclic combinations

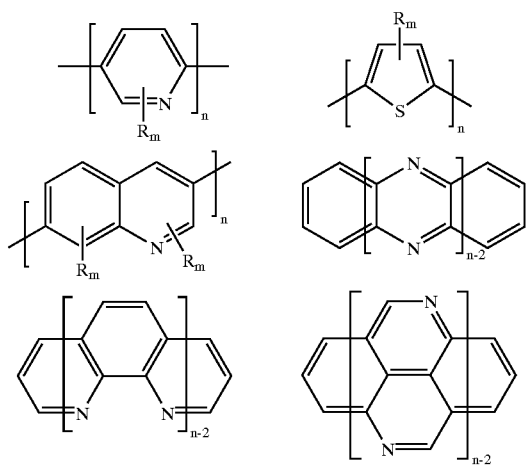

Scheme 4
Metal complexed organo-metallic compounds. (R:D, H, $C_1$–$C_{30}$ $C_1$–$C_{30}$ alkoxyl, $C_1$– $C_{30}$ silyl, aryl, heteroaryl; m is 1–4).

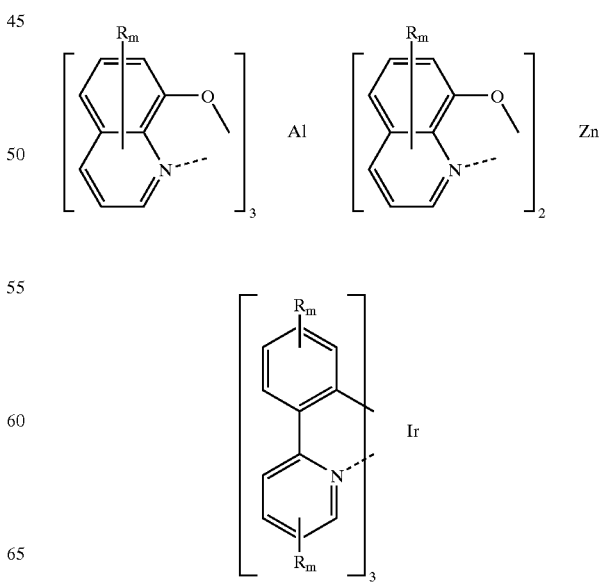

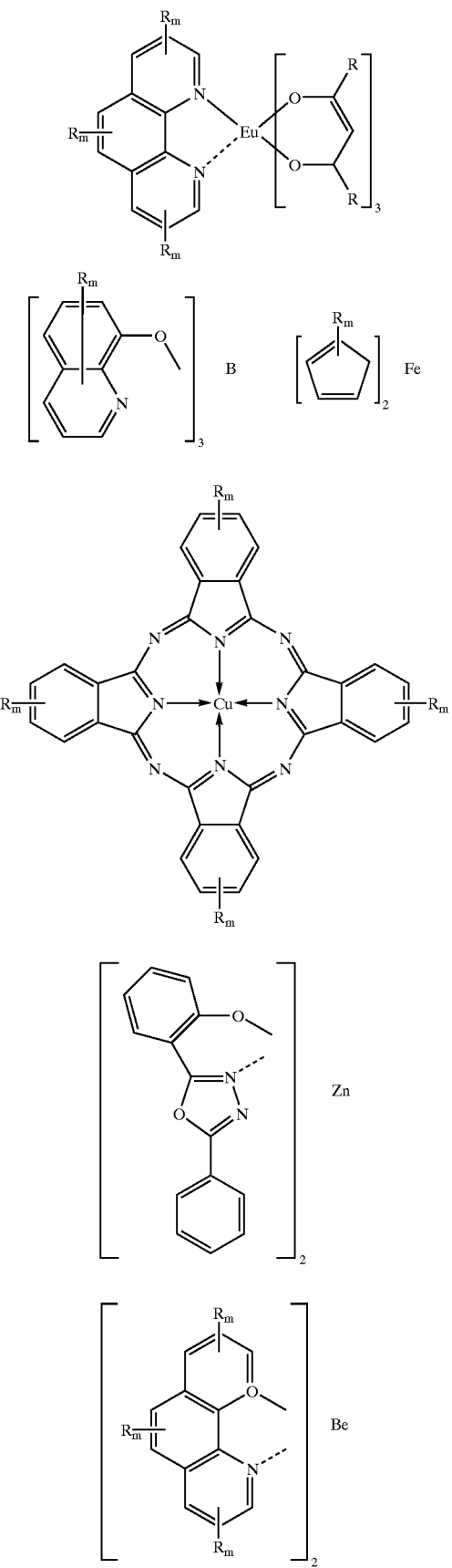
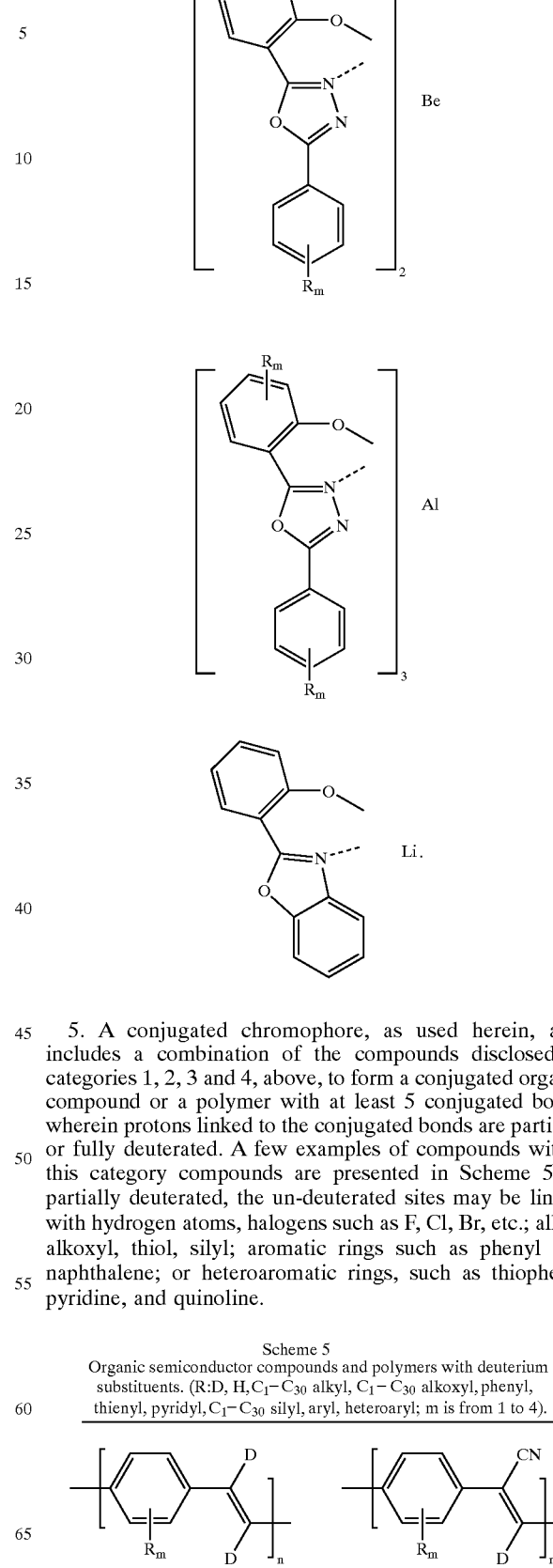

5. A conjugated chromophore, as used herein, also includes a combination of the compounds disclosed in categories 1, 2, 3 and 4, above, to form a conjugated organic compound or a polymer with at least 5 conjugated bonds wherein protons linked to the conjugated bonds are partially or fully deuterated. A few examples of compounds within this category compounds are presented in Scheme 5. If partially deuterated, the un-deuterated sites may be linked with hydrogen atoms, halogens such as F, Cl, Br, etc.; alkyl, alkoxyl, thiol, silyl; aromatic rings such as phenyl and naphthalene; or heteroaromatic rings, such as thiophene, pyridine, and quinoline.

Scheme 5
Organic semiconductor compounds and polymers with deuterium substituents. (R:D, H, $C_1-C_{30}$ alkyl, $C_1-C_{30}$ alkoxyl, phenyl, thienyl, pyridyl, $C_1-C_{30}$ silyl, aryl, heteroaryl; m is from 1 to 4).

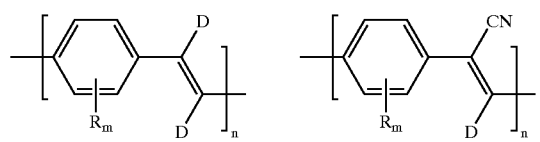

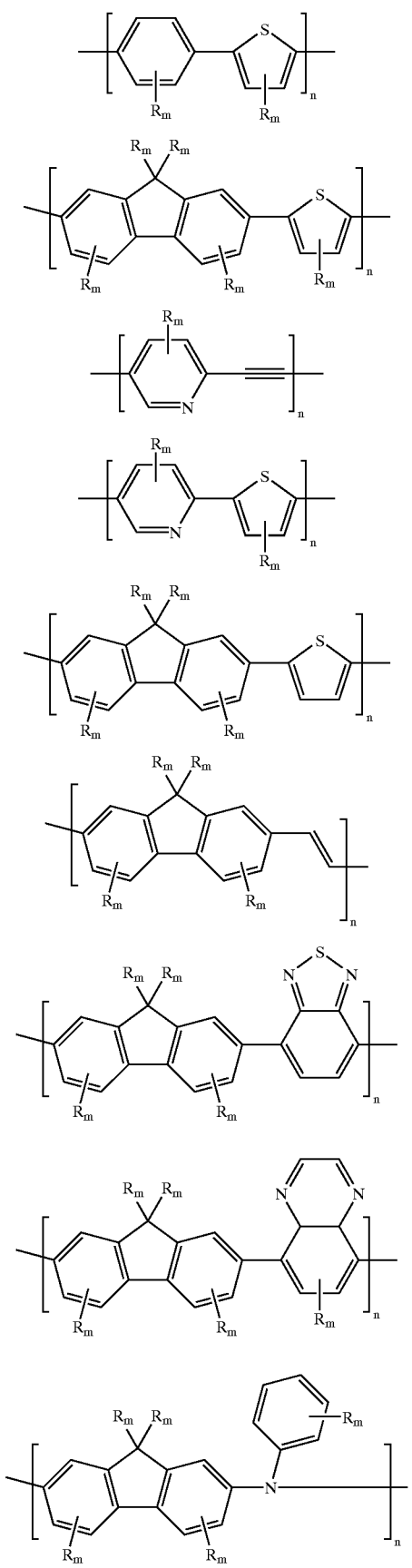
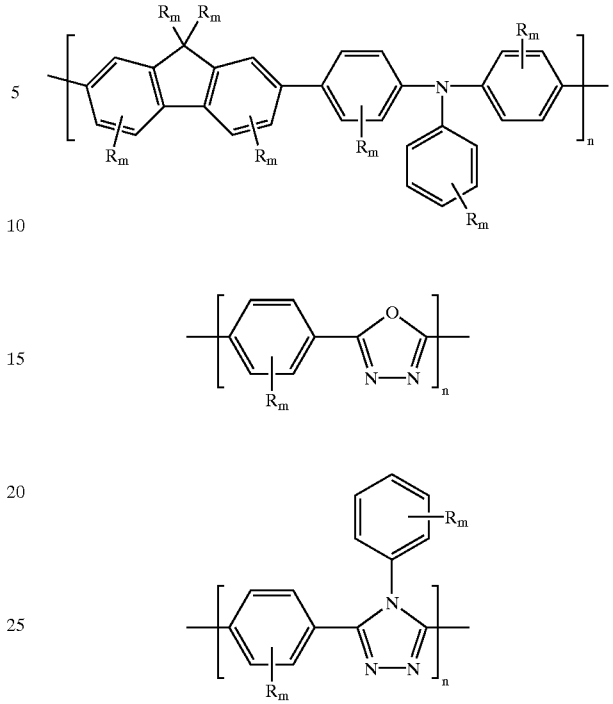

The present invention is also directed to organic electronic devices containing the foregoing deuterated conjugated semiconducting compounds and polymers. Such devices typically include at least one thin film of the deuterated conjugated compound or polymer coupled to a pair of electrodes. Additional thin films of conjugated semiconducting material can be used. In such cases, one thin film may be configured to promote electron transport and a second thin film may be tuned to promote hole transport. When the organic electronic device is fabricated with a plurality of thin films of conjugated semiconducting compounds or polymers, the thin films are preferably tuned to promote balanced electron and hole transport between the first and second electrodes. Typical organic electronic devices include, but are not limited to, a LED, a thin film transistor, a photovoltaic solar cell, an electrochemical luminescent display device, an electrochromic display device, and an electroluminescent device for active flat-panel display applications.

FIG. 1 shows the sectional structure of a typical single layer light-emitting device 10. The LED device 10 includes a clear substrate 12 having an anode coating 14. A single layer of deuterated semiconducting luminescent polymer 16 is deposited between the anode 14 and a cathode 18. An electrical potential 20 connects the anode 14 and cathode 18.

In many cases, a double or a multi-layer LED may be fabricated, in which one or two different charge-transporting layers are used. The charge-transporting layer may be an electron-transporting layer or a hole-transporting layer. Each individual layer may be a polymeric or organic film with a thickness less than 1500 μm, preferably less than 300 nm.

Figure 2:
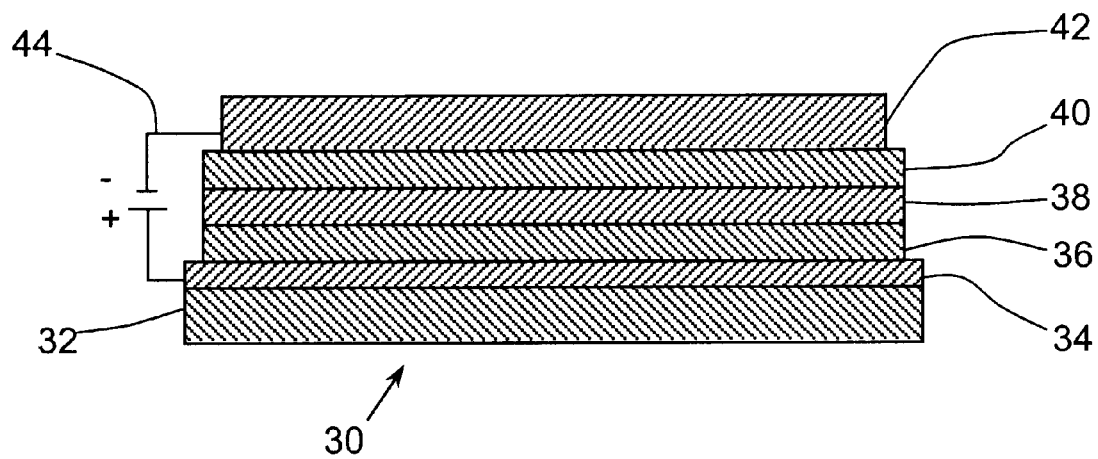
FIG. 2 is a cross-section illustration of a typical triple layer light emitting device.

FIG. 2 shows a section diagram of a typical three-layer LED 30. As shown in FIG. 2, the anode substrate 34, preferably ITO on a clear substrate 32, may be pre-coated with a layer of a hole-transporting material 36 either by spin-coating, or by printing. A typical hole-transporting layer 36 can be selected from, but not limited to, polyaniline, poly(phenylenevinylene), poly(3,4-ethylenedioxythiophene) (PEDOT) (doped with polystyrene sulfonic acid), poly(N-vinyl carbazole) (PVK), or an aromatic amine organic compound or polymer. The thickness of the hole-transporting layer 36 is preferably between 0.5 nm to 500 nm, and more preferably less than 150 nm. A deuterated semiconducting luminescent polymer layer 38 is disposed on the hole-transporting material 36. The solvent used to fabricate the luminescent polymer layer 38 is selected to be compatible hole-transporting layer 36 such that it does not dissolve the hole-transporting layer 36. Depending on the luminescent polymer utilized, the luminescent layer 38 can emit various colors from red, yellow, green, to blue. The thickness of the luminescent layer 38 is preferably between 10 nm to 300 nm, preferably between 50 nm to 200 nm.

The device 30 may be further coated with a layer of an electron-transporting material 40 either by spin-coating or by printing. A typical electron-transporting layer 46 can be selected from, but is not limited to, poly(aromatic oxadiazole) [X. -C. Li, et al., *J. Chem. Soc. Chem. Commun.*, p. 2211, 1995], organic compounds containing aromatic oxadiazoles, triazoles, quinolines, such as 2-tert-butyl-phenyl-5-biphenyl-1,3,4-oxadiazole (PBD), and Alq3. Evaporation or solution coating may be employed. For solution coating (spin-coating or printing), it is again important to select a suitable solvent for the electron transporting solution or ink that does not corrode or dissolve the luminescent polymer layer 38, hole-transporting layer 44, or anode 42. Luminescent polymers formulated as luminescent ink with cross-linking ability may be used. In a preferred embodiment, the cross-linking process can be accomplished by UV irradiation or moderate thermal treatment (less than 300° C.) of the inked anode substrate after printing.

The cathode metal 42 can be deposited either by thermal vacuum evaporation, or by sputtering. The presently preferred cathode metals are aluminum, calcium and magnesium. The thickness of the cathode layer 42 is preferably between 0.5 nm to 5000 nm, preferably thicker than 50 nm. An electrical potential 44 connects the anode 34 and cathode 42.

EXAMPLES

The following examples are given to illustrate various embodiments within the scope of the present invention. These are given by way of example only, and it is to be understood that the following examples are not comprehensive or exhaustive of the many types of embodiments of the present invention that can be prepared in accordance with the present invention.

Example 1

Green Luminescent poly(phenylene vinylene) with Deuterium via Bromo-Precursor Route

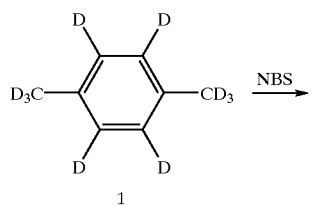

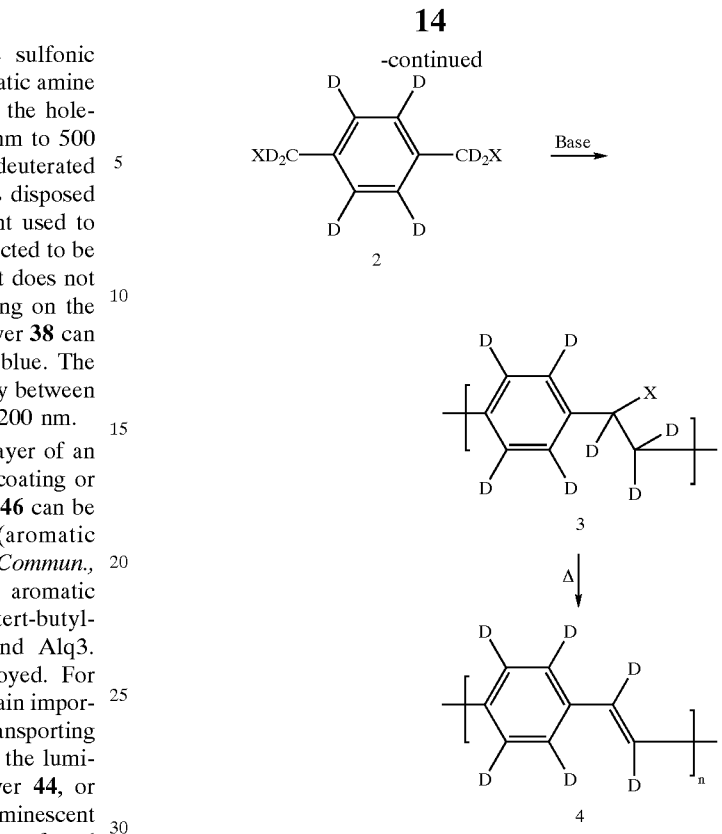

Synthesis of Deuterated 1,4-bisbromomethyl-benzene 2

Deuterated Xylene-d10 (1.644 g, 14.14 mmol) and N-bromosuccinimide (NBS) (5.6 g, 28.99 mmol) were dissolved in carbon tetrachloride (15 mL) at room temperature. After being degassed 3 times, the mixture was heated by an IR lamp to reflux using light irradiation. The reaction was carried out for 6 hours, and cooled down to room temperature. After filtration, the solid was washed by dichloromethane (3×30 mL), and the solution portions were collected. Evaporation of the solvents gave oil product that was purified by silica flash column using hexane and the mixture of ethyl acetate/hexane (1:10, v/v) to give white solid 2 (1.87 g, 49%). Rf=0.46 (EtOA/hexane, 1:3, v/v).

Synthesis of Bromo-Precursor Deuterated PPV 3

Deuterated 1,4-bisbromomethyl-benzene 2 (0.8 g, 2.941 mmol) was dissolved in anhydrous tetrahydrofuran (7 mL) and degassed. The solution was cooled down to 0° C. using an ice bath. Potassium tert-butoxide (2.94 mL, 1.0 M in THF, 2.94 mmol) was added into the solution dropwise. The addition was finished within 20 minutes, and the light yellow solution was stirred at 0° C. for 4 hours. The solution was poured into methanol (100 mL) to give the precursor polymer precipitate (58%).

Luminescent Thin Film of Deuterated PPV 4 via Bromo-Precursor 3

The yellow polymer 3 can be soluble in THF, and a thin polymer film of 3 can be cast on a glass substrate. Green luminescent polymer 4 can be obtained by heat treatment of 3 at 160° C. for 4 hours under nitrogen or under vacuum.

Examples 2

Green Luminescent Poly(phenylene vinylene) with Deuterium Substituents via Sulfonium-Precursor Route

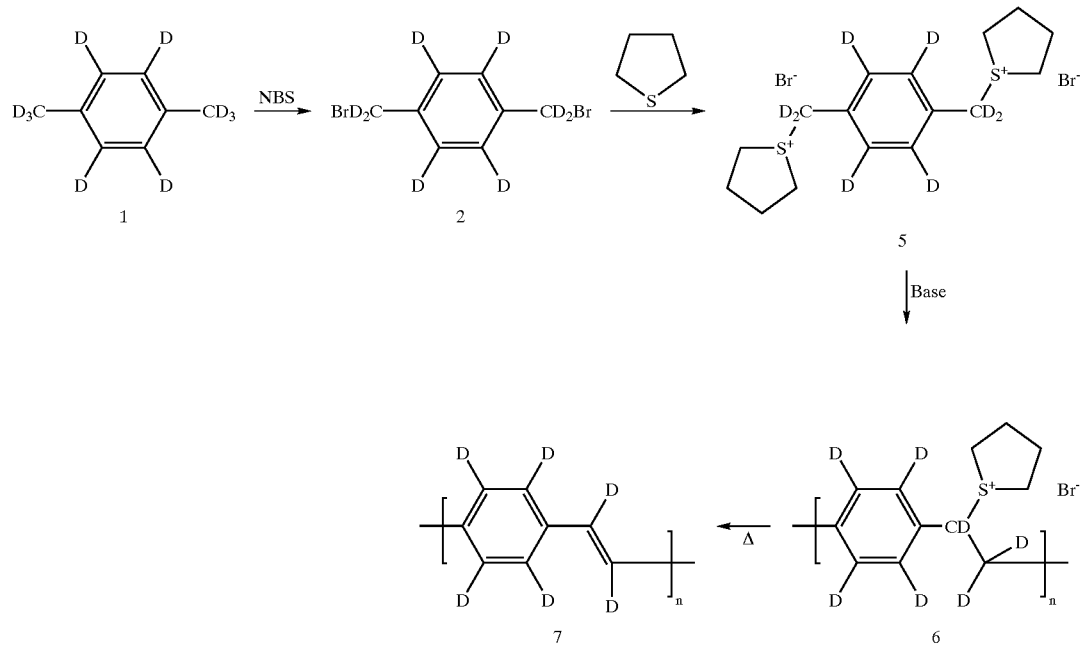

Synthesis of Sulfonium Monomer 5

Deuterated 1,4-bisbromomethyl-benzene 2 (1.0 g, 3.676 mmol) and tetrahydrothiophene (1.62 g, 18.5 mmol) were dissolved in anhydrous methanol (12 mL), and the mixture was heated to 50° C. The reaction was carried out under nitrogen for 16 hours. The solvent was evaporated under vacuum to give white slurry that was washed by anhydrous chloroform (1×8 mL). The beige powder was dried under vacuum at 0° C. to yield the sulfonium monomer 5 (1.2 g, 68%).

Synthesis of Sulfonium-Precursor Deuterated PPV 6

The sulfonium monomer 5 (1.1 g, 2.30 mmol) was dissolved in methanol (8 mL) at 0° C. The mixture was degassed before the addition of sodium hydroxide (5.6 mL, 0.4 N in water, 2.25 mmol). The addition of NaOH was finished within 15 min. After reaction at 0° C. for 2 hours, the colorless solution was dialyzed against degassed water using a dialysis tube (Lancaster) to remove oligomers and inorganic species. The dialysis process was repeated for 2 more times, with final dialysis against methanol. The resulting polymer 6 has a yield of 60%, and it is ready to prepare polymer thin films.

Luminescent Thin Film of Deuterated PPV 7 via Sulfonium-Precursor 6

The sulfonium polymer 6 is soluble in water and methanol, and is stable at 0° C. Polymer 6 is normally obtained in the mixture solvent of methanol and water with a concentration of 1% which is ready to cast thin film on glass substrate. Green luminescent polymer 7 can be obtained by heat treatment of 6 at 160° C. for 4 hours under nitrogen or under vacuum.

Figure 3:
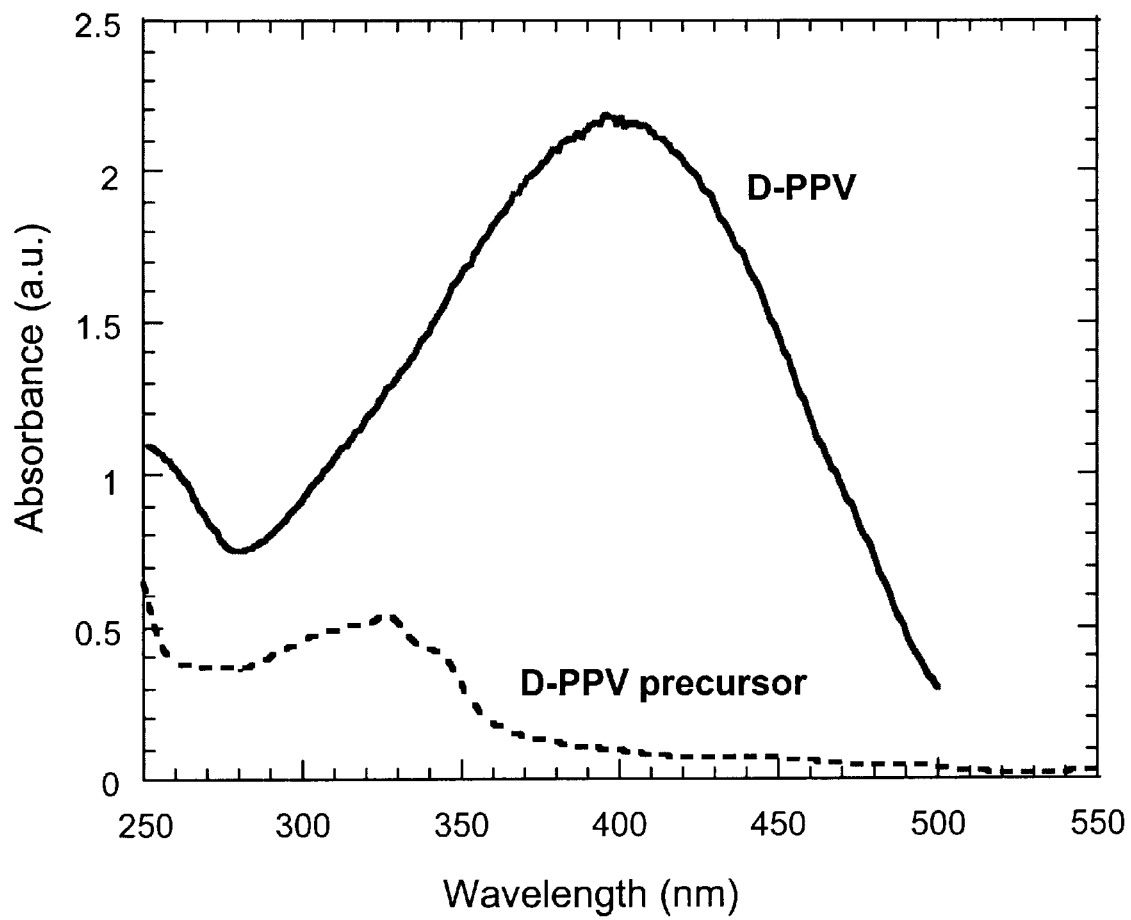
FIG. 3 is a graph of the UV spectrum of the sulfonium polymer precursor and the converted conjugated polymer deuterated PPV (D-PPV), showing the band gap changes from 3.42 eV to 2.45 eV.
Figure 4:
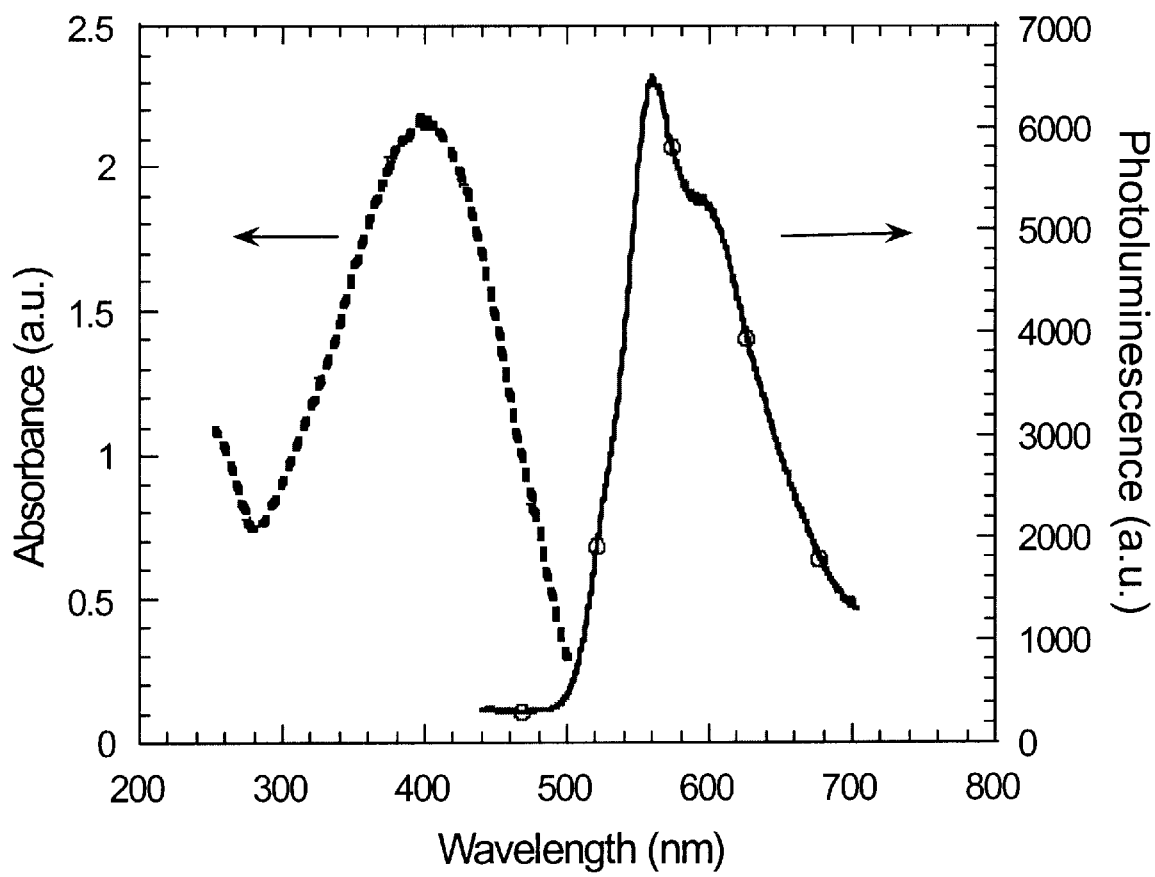
FIG. 4 is a graph of the ultraviolet (UV) and visible photoluminescent spectrum of the deuterated polymer D-PPV.

When the polymer 6 is converted to 7, its conjugation length is increased which is shown in the UV-Visible spectroscopy. FIG. 3 shows the UV spectral change of this conversion, showing the band gap changes from 3.42 eV to 2.45 eV. After conversion, the polymer 7 fluoresces green with the PL peak located at 550 nm, shown in FIG. 4.

Example 3

Normal PPV Polymer Synthesis via Sulfonium Srecursor (for comparison)

Normal PPV precursor polymer can be obtained by polymerization of the monomer, (Aldrich) following the similar procedure as illustrated in example 2. The normal PPV polymer has very similar optical and electronic properties as D-PPV. Comparative photoluminescence (PL) quantum efficiency measurements showed that the deuterated PPV photoluminescence quantum efficiency compared to that of normal PPV was: DPPV/PPV=1.2, which means that the deuterated PPV has a brighter photoluminescence than normal PPV.

Example 4

Red Luminescent Partially Deuterated poly(2-methoxy-5-ethylhexyloxy-phenylene Vinylene) (Partially Deuterated MEH-PPV)

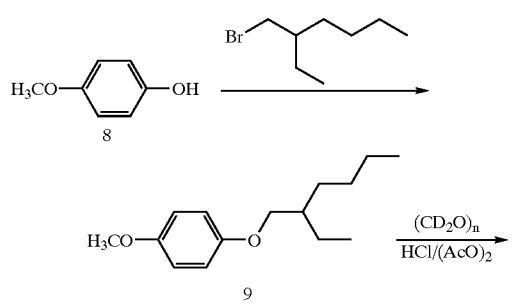

-continued

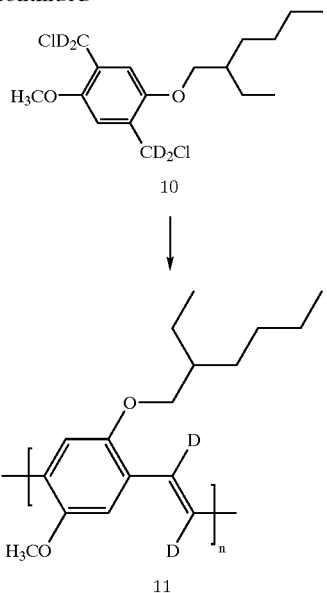

The Synthesis of 1-(2-ethyl-hexyloxy)-4-methoxy-benzene 9:

4-methoxylphenol (24.8 g, 200 mmol) and sodium hydroxide pellets (8.8 g, 220.0 mmol) were charged into a 500 mL two neck flask equipped with a condenser and a septum. The flask was degassed 3 times before adding anhydrous methanol (150 mL) via an annular tube. The solution became hot while stirring. It was heated to reflux for 20 min, and then cooled down to room temperature. 2-Ethylhexyl bromide (39 mL, 220 mmol) was then added by a syringe at room temperature, dropwise (15 min.). The mixture was heated to reflux for 20 hour. The methanol was removed by distillation, and then 150 mL ether was added. Deionized water (100 mL) was added to dissolve inorganic salts. The aqueous phase was washed by ether (3×50 mL), and the combined portions of ether was washed by brine (2×50 mL), dried over sodium sulfate, and evaporated to remove ether. The obtained oil was fraction distillated to remove the unreacted ethylhexyl bromide, and the final product was collected in the fraction of 130–135° C. (2 mm Hg) as a clear oil (35.8 g, 76%).

Synthesis of 1,4-bis-chloromethyl-d4-2-(2-ethylhexyloxy)-5-methoxy-benzene 10

1-(2-ethyl-hexyloxy)-4-methoxy-benzene 9 (5.9 g, 24.97 mmol) and parafoadehyde-d2 were charged into a 100 mL two neck flask, and degassed by pumping/nitrogen inlet (3 times). Hydrochloric acid (37%, 11.2 mL, 500 mmol) was added by a syringe. While stirring at room temperature, acetic anhydrate was added dropwise to control keep the reaction mixture from becoming too hot. The addition of the acetic anhydrate was finished within 30 minutes. The mixture was then heated to 75° C. under nitrogen while stirring. After reaction of 8 hours, the mixture was poured into water (200 mL), and the aqueous phase was extracted with ethyl acetate (3×80 mL). The combined organic phase was washed with brine (2×50 mL), dried over magnesium sulfate. Evaporation of the organic solvent yielded the crude slurry, which was purified by a silica flash column using hexane and ethyl acetate/hexane mixture (10% to 20%) to give the product (45%). Rf=0.66 (EtOAC/hexane, 1/3, v/v).

Synthesis of Poly(2-methoxy-5-ethylhexyloxy-phenylene Vinylene) with Deuterium Substituent on Vinyl (Partially Deuterated MEH-PPV) 11

1,4-bis-chloromethyl-d4-2-(2-ethylhexyloxy)-5-methoxy-benzene 10 (0.62 g, 1.84 mmol) was charged into a 100 mL two neck flask and degassed by pumping/nitrogen inlet (3 times). Anhydrous tetrahydrofuran (60 mL) was added to dissolve the monomer. Potassium tert-butoxide solution (11.0 mL, 1.0 M in THF, 11.0 mmol) was added dropwise into the stirring solution within 20 min. The colorless solution became red and viscous. The reaction was carried out under nitrogen for 18 hours under dark condition. The viscous solution was poured into methanol (300 mL) to give a red precipitate, which was purified by repeated precipitation (2 times more) from its solution of chloroform into methanol. A red polymer was obtained with a yield of 56%.

Figure 5:
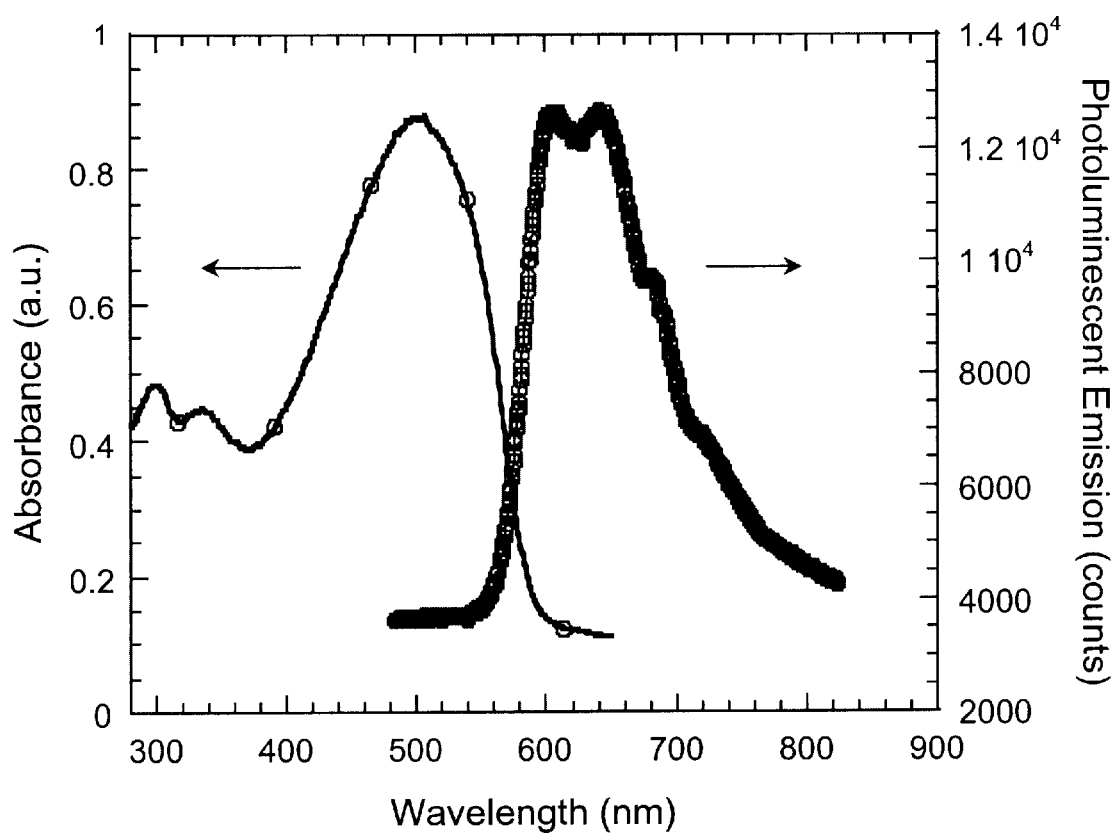
FIG. 5 is a graph of the ultraviolet (UV) spectra and the photoluminescent spectrum (excited by 400 nm UV light) of semi-deuterated MEH-PPV.

The partially deuterated MEH-PPV had a π-π* band gap of 2.1 eV as illustrated in FIG. 5. The polymer luminesces red in solution and in thin film states. FIG. 5 shows the photoluminescent spectrum (excited by 400 nm UV light), showing a red luminescent color (located around 620 nm).

Example 5

Red Luminescent MEH-PPV with Deuterium Atom Substituents on Both Vinyl and on Phenyl

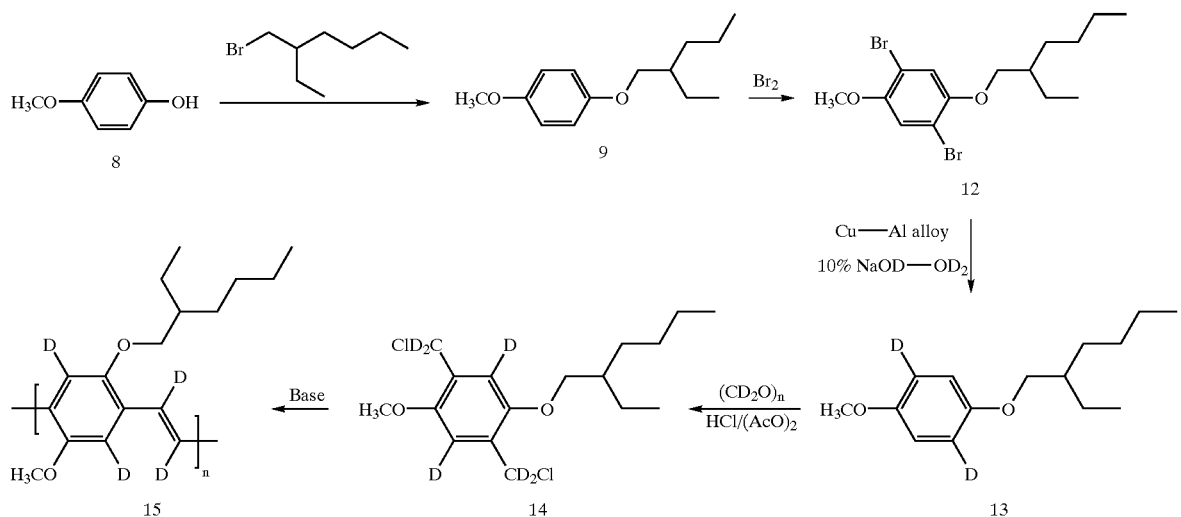

According to the above synthesis scheme, the red luminescent deuterated MEH-PPV 15 is prepared following the similar chemical procedure as described in Example 4. The compound 13 is prepared by the chemistry procedure described in: H. Tsuzuki, et al., *J. Chem. Research,* 1994, 1701–1716.

Example 6

Red Luminescent Poly(2,5-dioctyl-phendylene Vinylene) with Deuterium Atom Substituents on Vinyl and on Phenyl

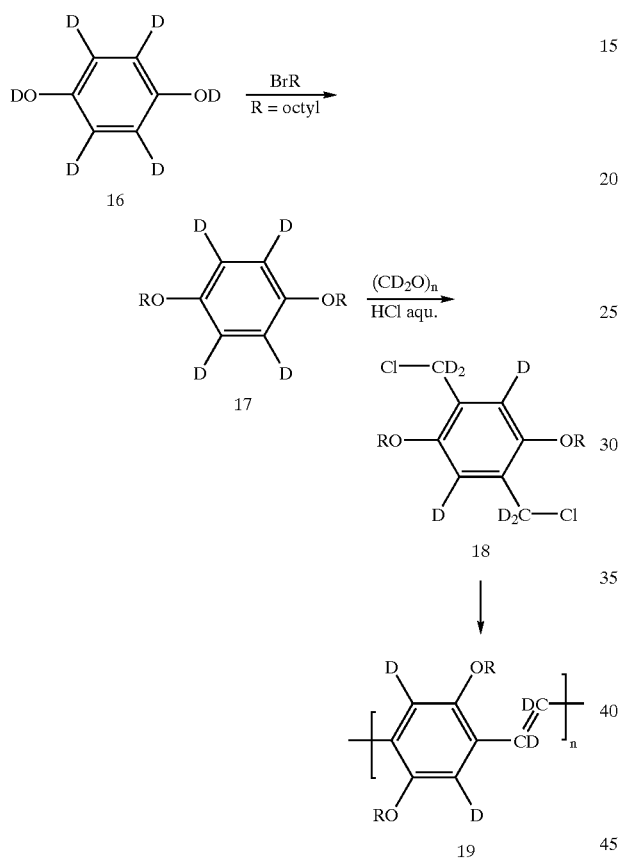

By using the deuterated starting compound 16, red luminescent poly(dioctylocyl-phenylene vinylene) 19 can be prepared according to the above scheme with the similar procedures as described in Example 4.

Example 7

Blue Luminescent poly(9,9'-dioctyl-fluorene) with Deuterium atom Dubstituents

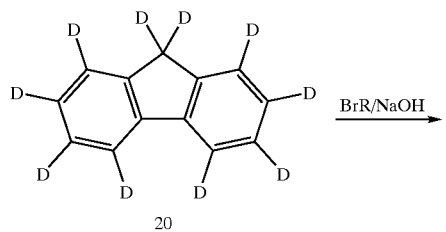

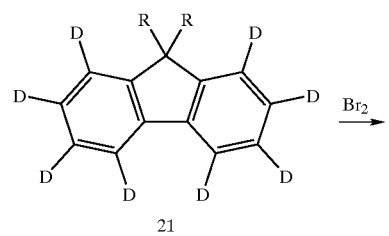

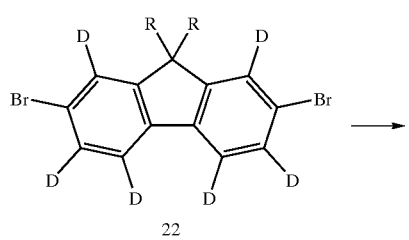

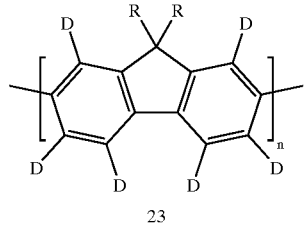

By using the deuterated fluorene 20, blue luminescent poly (9,9-dialkyl fluorene) 23 can be prepared according to the above scheme with the similar procedures as described in E. P. Woo et al., U.S. Pat. No. 5,962,631.

Example 8

Phosphorescent Dopant Metal Complex with Deuterium Atoms

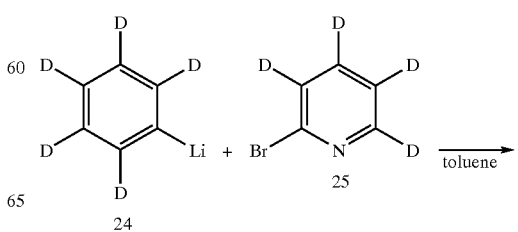

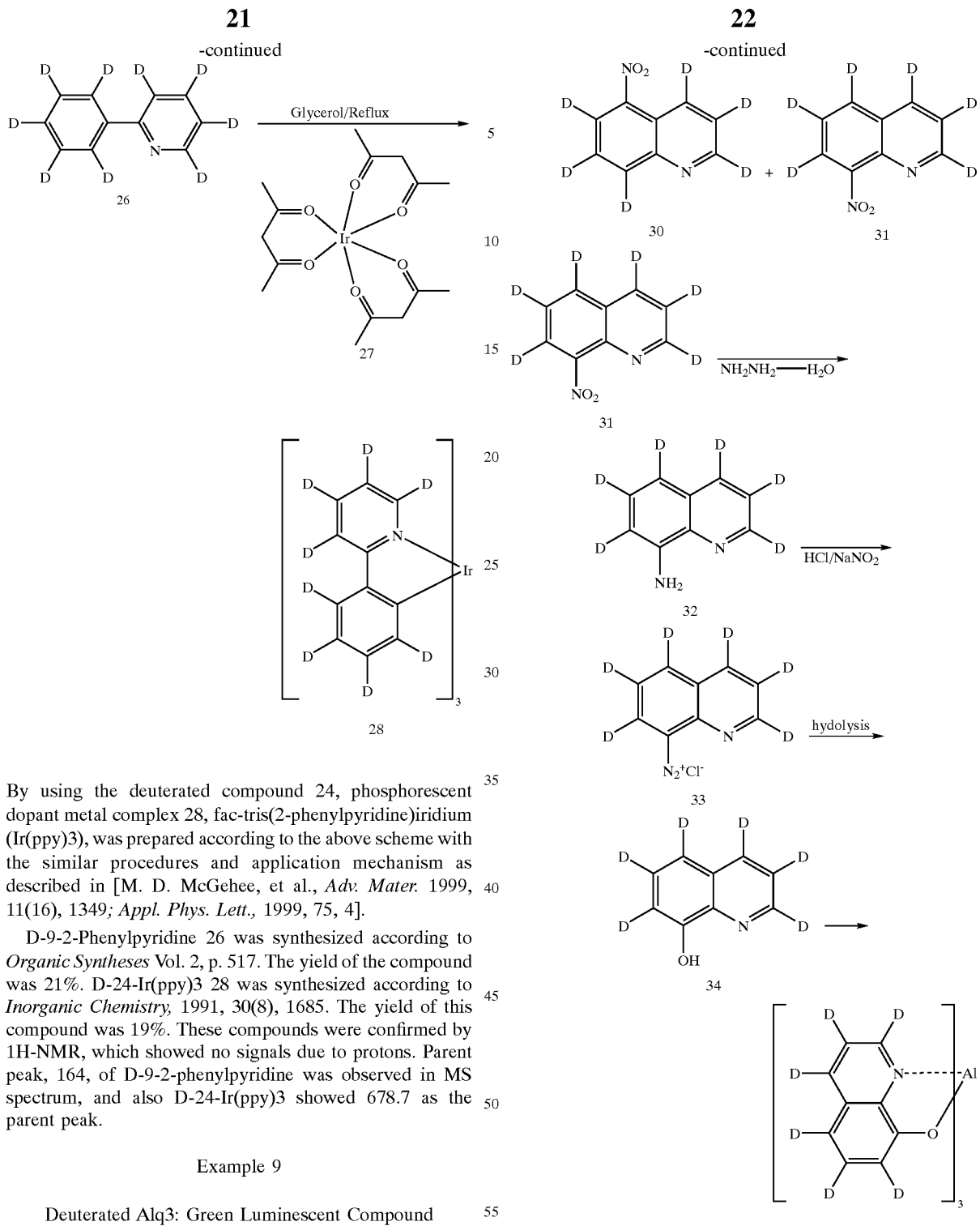

By using the deuterated compound 24, phosphorescent dopant metal complex 28, fac-tris(2-phenylpyridine)iridium (Ir(ppy)3), was prepared according to the above scheme with the similar procedures and application mechanism as described in [M. D. McGehee, et al., *Adv. Mater.* 1999, 11(16), 1349; *Appl. Phys. Lett.*, 1999, 75, 4].

D-9-2-Phenylpyridine 26 was synthesized according to *Organic Syntheses* Vol. 2, p. 517. The yield of the compound was 21%. D-24-Ir(ppy)3 28 was synthesized according to *Inorganic Chemistry*, 1991, 30(8), 1685. The yield of this compound was 19%. These compounds were confirmed by 1H-NMR, which showed no signals due to protons. Parent peak, 164, of D-9-2-phenylpyridine was observed in MS spectrum, and also D-24-Ir(ppy)3 showed 678.7 as the parent peak.

Example 9

Deuterated Alq3: Green Luminescent Compound Preparation

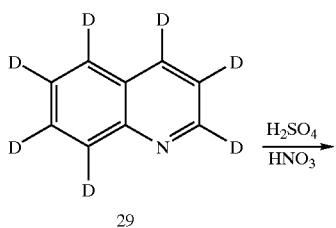

By using the deuterated quinoline 29, green luminescent metal complex 35, deuterated tris-(8-hydroxyquinoline) aluminum, can be prepared according to the above scheme with the similar procedures and application mechanism as described in: [Kuznetsoua, "Complex compounds of metals with some nitrogen containing ligands", *Zhurnal obshchey khimii*, vol. XLVI (CVIII), No. 3, Mar. 1976, pp. 670–675; Hamada et al., "Organic Electroluminescent Devices with 8-Hydroxyquinoline Derivative-Metal Complexes as an Emitter," *Japanese Journal of Applied Physics*, vol. 32, Part 2, No. 4A, Apr. 1, 1993, pp. L514–L515; Tang et al., "Organic electroluminescent diodes," *Applied Physics Letters*, vol. 51, No. 12, Sep. 21, 1987, pp. 913–915.]

Example 10

Electroluminescence of fac-tris(2-phenylpyridine) iridium Ir(ppy)3 (for comparison)

Figure 6:
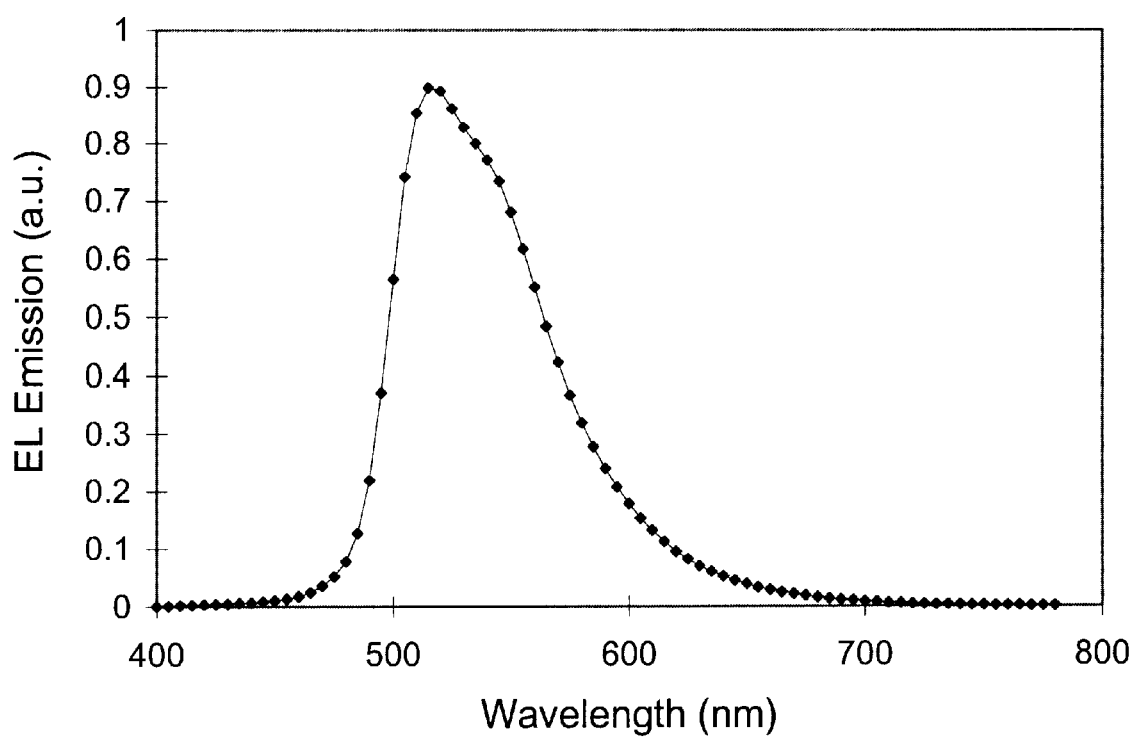
FIG. 6 is a graph of the electroluminescence spectrum of $Ir(ppy)_3$ in the device structure of ITO/NPD 40 nm/CBP+11% $Ir(ppy)_3$ 20 nm/BCP 10 nm/Alq3 40 nm/LiF 0.75 nm/Al.

A device of ITO/NPD 40 nm/CBP+11% $Ir(ppy)_3$ 20 nm/BCP 10 nm/Alq3 40 nm/LiF 0.75 nm/Al, where NPD denotes to N,N'-bis(naphthyl)-N,N'-diphenylbenzidine, CBP denotes to carbazole biphenyl, was fabricated following a similar procedure as described in: *Appl. Phys. Lett.*, 75, 4 (1999). Each layer was formed and controlled by vacuum thermal evaporation. The NPD was used as a hole transporting layer; the CBP was used as the host with the phosphorescent dopant, $Ir(ppy)_3$, as the emissive layer; BCP was used as the exciton blocking layer; Alq3 as electron transporting layer; LiF was used as cathode modification layer; Al was used as the cathode metal. Bright green luminescence (electrophosphorescence) was observed at a voltage of 5 V. The electroluminescence spectrum was shown in FIG. 6.

Example 11

Electroluminescence of fac-tris(2-phenylpyridine) iridium-d8 $Ir(ppy)_3$-d8

Figure 7:
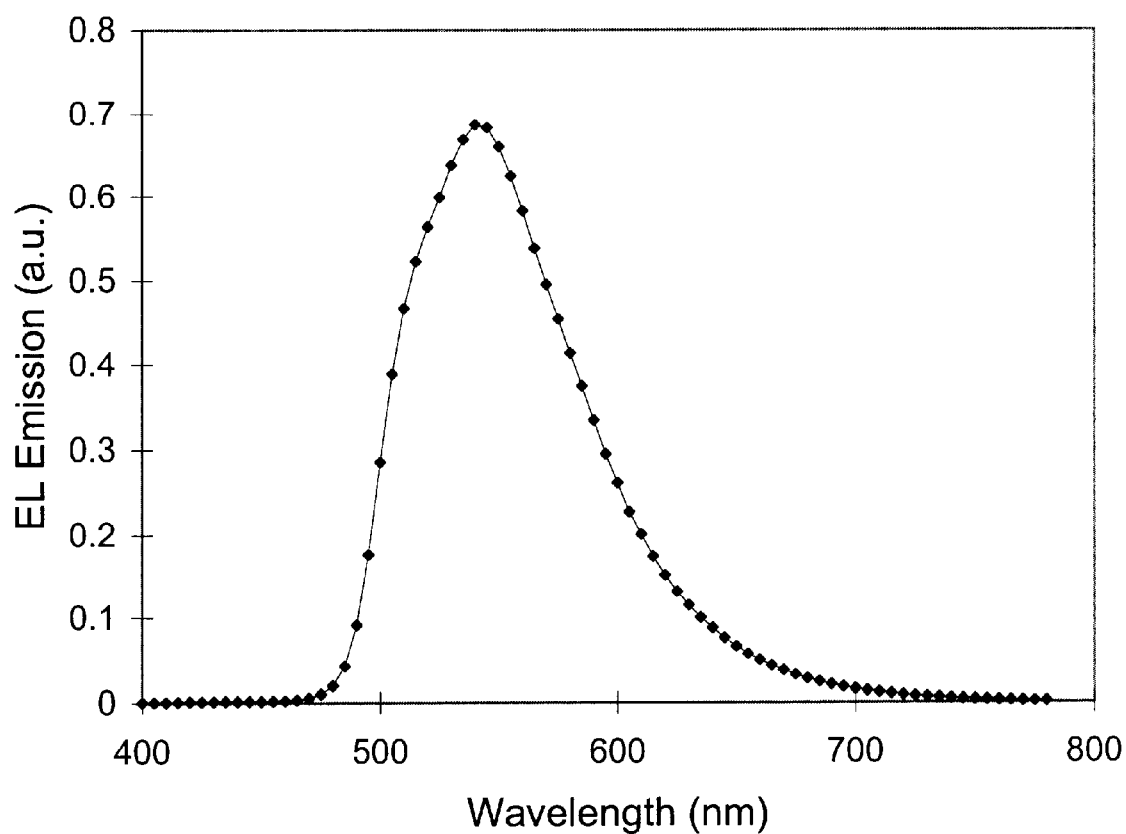
FIG. 7 is a graph of the electroluminescent spectrum of $Ir(ppy)_3$-d8 in the device structure of ITO/NPD 40 nm/CBP+11% $Ir(ppy)_3$-d8 20 nm/BCP 10 nm/Alq3 40 nm/LiF 0.75 nm/Al.

A device of ITO/NPD/CBP+11% $Ir(Ppy)_3$-d8 20 nm/BCP 10 nm/Alq3 40 nm/LiF 0.75 nm/Al, was fabricated following a similar procedure as described in Example 10. Bright green luminescence (electrophosphorescence) was observed at a voltage of 5 V. The electroluminescence spectrum was shown in FIG. 7.

Figure 8:
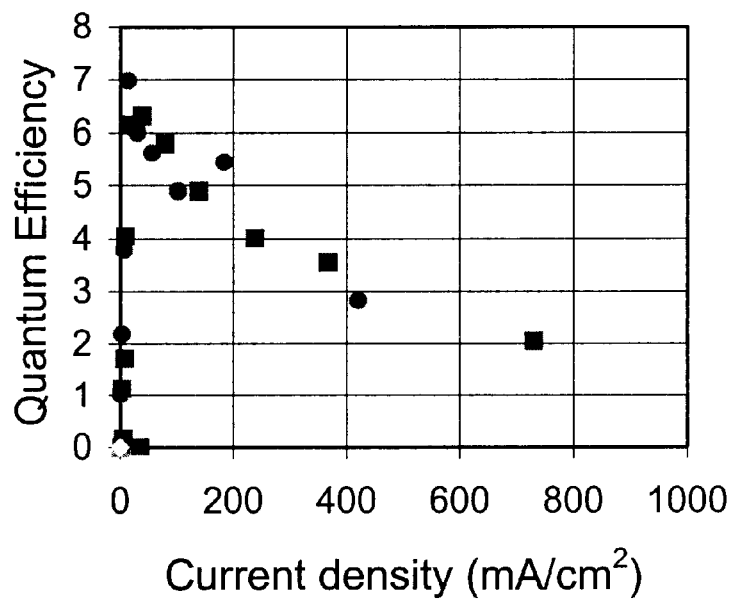
FIG. 8 is a comparison graph of the relationship of external quantum efficiency vs. current density for the device in Example 10 (square) and for the device in Example 11 (circle).

FIG. 8 shows the relationship of quantum efficiency (%, photons per electron) vs. current density ($mA/cm^2$) for the device in Example 10 (square symbols) with the device of Example 11 using deuterium Ir(ppy)3-d8 (circle symbols). From FIG. 8, the device of Example 11 has higher quantum efficiency than the device of Example 10.

Figure 9:
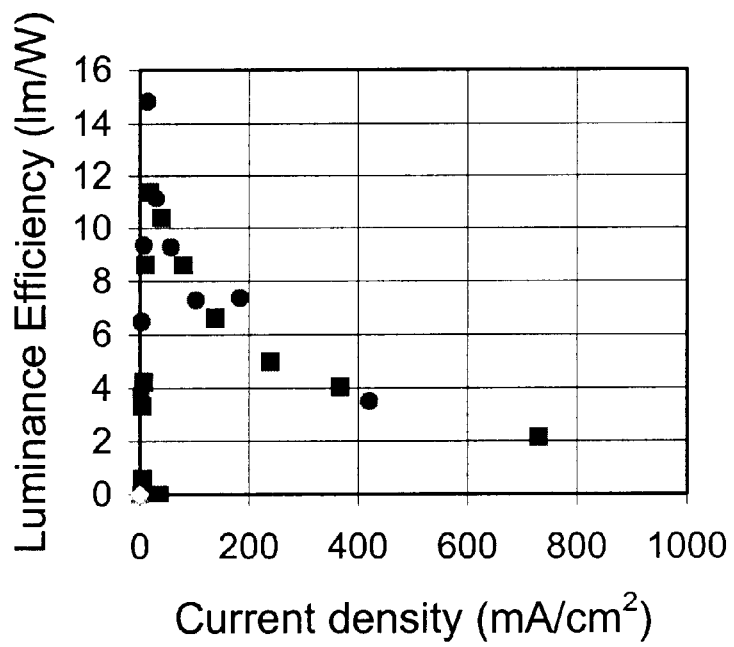
FIG. 9 is a comparison graph of the relationship of luminance efficiency vs. current density for the device in Example 10 (square) and for the device in Example 11 (circle).

FIG. 9 shows the relationship of luminance efficiency (lm/W) vs. current density ($mA/cm^2$) for the device in Example 10 (square symbols) with the device of Example 11 using deuterium Ir(ppy)3-d8 (circle symbols). From FIG. 9, the device of Example 11 has higher luminance efficiency than the device of Example 10.

It will be appreciated that the present invention provides new organic semiconductor materials that exhibit high luminescence, excellent stability, and good lifetime. This is achieved by chemically modifying known and novel optoelectronic materials by replacing protons with deuterium atoms on the conjugated chromophores. New luminescent organic materials are designed and synthesized containing deuterium atoms for their application in optoelectronic devices, including light-emitting devices. Such OLEDs prepared with deuterated organic semiconductor materials have brighter luminance and better thermal stability compared to non-deuterated organic semiconductor materials.

The present invention may be embodied in other specific forms without departing from its essential characteristics. The described embodiments are to be considered in all respects only as illustrative and not restrictive. The scope of the invention is, therefore, indicated by the appended claims rather than by the foregoing description.

What is claimed is:

1. An organic luminescent device comprising:
   a first electrode surface;
   a first thin film of conjugated luminescent polymer comprising an organic semiconductor, said organic semiconductor comprising a conjugated chromophore with a linear conjugated organic compound or a polymer with at least 5 conjugated bonds, wherein protons linked to the conjugated bonds are partially or fully deuterated, and wherein the luminescent polymer is substantially electrically coupled to the first electrode surface; and
   a second electrode, substantially electrically coupled to the conjugated luminescent polymer.

2. An organic luminescent device according to claim 1, wherein the conjugated chromophore is partially deuterated, and wherein un-deuterated sites are chemically bound to a moiety selected from hydrogen atoms, halogen atoms, alkyl, alkoxyl, thiol, silyl, aromatic rings, or heteroaromatic rings.

3. An organic luminescent device according to claim 1, wherein the organic semiconductor is luminescent.

4. An organic luminescent device according to claim 1, wherein the organic semiconductor possesses charge injection, hole blocking, or exciton blocking properties.

5. An organic luminescent device according to claim 1, wherein the organic semiconductor promotes energy transfer.

6. An organic luminescent device according to claim 1, wherein the organic semiconductor produces greater than 25% singlet excitons for light emission.

7. An organic luminescent device according to claim 1 wherein the first thin film is fabricated by solution spin coating or ink jet printing method.

8. An organic luminescent device comprising:
   an first electrode surface;
   a first thin film of conjugated luminescent polymer comprising an organic semiconductor, said organic semiconductor comprising a luminescent chromophore having at least five conjugated bonds arranged as a linear conjugated organic compound or polymer wherein protons linked to the conjugated bonds are fully or partially deuterated, and wherein the luminescent polymer is substantially electrically coupled to the first electrode surface; and
   a second electrode, substantially electrically coupled to the conjugated luminescent polymer.

* * * * *

UNITED STATES PATENT AND TRADEMARK OFFICE
CERTIFICATE OF CORRECTION

PATENT NO. : 6,579,630 B2
DATED : June 17, 2003
INVENTOR(S) : Xiao-Chang Charles Li It is certified that error appears in the above-identified patent and that said Letters Patent is hereby corrected as shown below:

Column 1,
Line 30, "Bum" should read -- Burn --;
Line 37, "Gamier" should read -- Garnier --; and
Line 65, "a" should be deleted.

Column 3,
Line 7, "know" should read -- known --;
Line 58, "lead" should read -- leading --;
Line 61, "lead" should read -- leads --.

Column 4,
Line 67, "particularly" should read -- particular --.

Column 8,
Line 24, "or a" should read -- or an --;
Line 33, "category" should read -- category's --; and
Line 43, "$C_1$-$C_{30}$" should read -- $C_1$-$C_{30}$ alkyl, --.

Column 10,
Line 51, "category" should read -- category's --.

Column 12,
Line 44, "a LED," should read -- an LED --; and
Line 60, "1500µm," should read -- 1500nm --.

Column 15,
Line 1, "Examples 2" should read -- Example 2 --.

Column 16,
Line 37, "Srecursor" should read -- Precursor --.

Column 17,
Line 36, "hour" should read -- hours --.

Column 19,
Line 10, "phendylene" should read -- phenylene --; and
Line 56, "substituents" should read -- Substituents --.

UNITED STATES PATENT AND TRADEMARK OFFICE
CERTIFICATE OF CORRECTION

PATENT NO.   : 6,579,630 B2
DATED        : June 17, 2003
INVENTOR(S)  : Xiao-Chang Charles Li It is certified that error appears in the above-identified patent and that said Letters Patent is hereby corrected as shown below:

Column 22,
Line 33, "hydolysis" should read -- hydrolysis --.

Column 23,
Line 7, "Ir(ppy)3" should read -- Ir(ppy)$_3$ --;
Line 30, "Ir(Ppy)$_3$" should read -- Ir(ppy)$_3$ --;
Line 39, "Ir(ppy)3-d8" should read -- Ir(ppy)$_3$-d8 --;
Line 45, "Ir(ppy)3-d8" should read -- Ir(ppy)$_3$-d8 --;

Signed and Sealed this

Tenth Day of August, 2004

JON W. DUDAS
*Acting Director of the United States Patent and Trademark Office*